United States Patent [19]
Poultney et al.

[11] Patent Number: 5,474,647
[45] Date of Patent: Dec. 12, 1995

[54] WAFER FLOW ARCHITECTURE FOR PRODUCTION WAFER PROCESSING

[75] Inventors: Sherman K. Poultney, Ridgefield; Peter B. Mumola, Huntington; Joseph P. Prusak, Danbury; George J. Gardopee, Southbury; Thomas J. McHugh, Bethel, all of Conn.

[73] Assignee: Hughes Aircraft Company, Los Angeles, Calif.

[21] Appl. No.: 153,236

[22] Filed: Nov. 15, 1993

[51] Int. Cl.⁶ .................................................. H01L 21/00
[52] U.S. Cl. ........................................ 156/626.1; 156/345
[58] Field of Search ................................. 156/626.1, 345; 204/298.32, 298.35, 192.33; 216/59–61, 84–86; 118/719

[56] References Cited

U.S. PATENT DOCUMENTS

| | | | |
|---|---|---|---|
| 5,176,783 | 1/1993 | Yoshikawa | 156/345 |
| 5,246,524 | 9/1993 | Kuroda et al. | 156/345 |
| 5,291,415 | 3/1994 | Zarowin et al. | 156/626 X |

FOREIGN PATENT DOCUMENTS

| | | |
|---|---|---|
| WO89/03586 | 4/1989 | European Pat. Off. . |
| 0514045A1 | 11/1992 | European Pat. Off. . |

*Primary Examiner*—Thi Dang
*Attorney, Agent, or Firm*—W. C. Schubert; W. K. Denson-Low

[57] ABSTRACT

A method for controlling the flow of semiconductor wafers within a semiconductor wafer processing facility. This method includes a wafer storage and preparation area (10) and a wafer metrology and etch area (12), both of which are monitored and/or controlled by a master controller (14). The wafer storage and preparation area (10) is typically kept at a class 10 clean room level and is comprised of a wafer storage area (16) and a wafer preparation area (18). The wafer metrology and etch area (12) is typically kept at a class 1000 clean room level and is comprised of an I/O cassette module (22), a wafer pre-aligner (24), a wafer router (26), a wafer metrology instrument (28), and a wafer etching instrument (30). The semiconductor wafers are transported, either manually or automatically, between the wafer storage area (16) and the wafer preparation area (18), as well as between the wafer storage and preparation area (10) and the wafer metrology and etch area (12), within wafer storage cassettes (20). The semiconductor wafers are individually transported between the I/O cassette module (22), the wafer pre-aligner (24), the wafer metrology instrument (28), and the wafer etching instrument (30) by the wafer router (26).

29 Claims, 4 Drawing Sheets

WAFER FLOW ARCHITECTURE FOR PRODUCTION WAFER PROCESSING

BACKGROUND OF THE INVENTION

The present invention generally relates to the production of processed semiconductor wafers and, in particular, relates to an apparatus and method for controlling the flow of semiconductor wafers through a wafer processing facility.

In one instance wherein the present invention concept is particularly practical, silicon-on-insulator (SOI) semiconductor wafers are generally subjected to both metrology and chemical etching processes prior to being subjected to thin film patterning processes for circuit formation. During a typical SOl semiconductor wafer metrology process, a metrology instrument measures the thickness of the active material layer of an SO1 semiconductor wafer. This thickness is measured and recorded so that the surface of the SOI wafer may later be thinned and smoothed via a localized chemical etching process. Such a metrology instrument is described in a related patent application entitled, apparatus and Method for Measuring the Thickness of Thin Films, U.S. patent application Ser. No. 07/804,872, filed on Dec. 6, 1991 now U.S. Pat. No. 5,333,049. During a typical chemical etching process, a chemical etching instrument induces the removal of specific amounts of material at specific locations along the surface of the SOI semiconductor wafer in order to achieve a desired thickness in the active material layer of the SOI semiconductor wafer. The amount and the location of the removed material is determined from recorded metrology process data. The material is removed as a result of a chemical reaction that occurs between the surface material of the SOI wafer and a plasma generated chemical etchant. Such a chemical etching instrument is described in a related patent application entitled, System for Removing Material from a Wafer, U.S. Pat. application Ser. No. 07/696,897, filed on May 7, 1991, now U.S. Pat No. 5,333,049.

Before the SOI wafer is subjected to either the above-described metrology process or the above-described chemical etching process it must be registered to both the metrology instrument and the chemical etching instrument, respectively, in a consistent manner to ensure that the SOI wafer is properly processed. That is, the position of the SOI wafer in the metrology instrument, and hence the recorded metrology data, must directly correlate with the position of the SOI wafer in the chemical etching instrument, and hence the intensity and location of the material removing chemical reaction. An apparatus for ensuring such consistent registration is described in a related patent application entitled, Apparatus for Providing Consistent Non-Jamming Registration of Semiconductor Wafers, U.S. patent application Ser. No. 07/937,793, filed on Aug. 28, 1992 now U.S. Pat. No. 5,352,249.

As is common in the semiconductor industry, the above-described metrology and chemical etching processes, along with the corresponding wafer registration procedures, must be performed in an atmosphere of extreme cleanliness. Furthermore, these processes must be performed under a high degree of control and accurate records must be kept of the individual wafers before, during, and after the performance of such processes. In a production environment, these requirements are often cosily to maintain with respect to both equipment and labor expenditures. Accordingly, it would be highly desirable to provide a wafer production environment having a high degree of cleanliness and near real time process control while decreasing the cost to maintain such an environment with respect to either equipment or labor or both.

SUMMARY OF THE INVENTION

The present invention contemplates an apparatus and method for controlling the flow of semiconductor wafers through a wafer processing facility. One key component of the present invention is a master controller that can perform several functions including maintaining records on all processed wafers, recording the processing status of all the wafers, controlling the routing of all the wafers between the different processing instruments, and controlling the actual processing of all the wafers. The master controller can also perform fault isolation and other diagnostics for the entire wafer processing facility.

The master controller functions in conjunction with the individual processing instruments, such as the metrology and the chemical etching instruments, to ensure that the wafers flow through the processing facility in an efficient and organized manner. The master controller initially records the entry of each wafer into the wafer processing facility. This initial recordation includes identifying each wafer according to its particular storage location within a bar-coded storage cassette. The cassette, and hence the wafers stored therein, is initially stored in a storage area, but is later transported, either manually or automatically, to a wafer processing area where the wafer processing instruments are located. In the wafer processing area, the master controller has each wafer routed between the associated wafer processing instruments. The master controller also controls the actual processing of the wafers by supplying each processing instrument with input data that is necessary for each processing instrument to perform its respective process, such as supplying the metrology instrument with the material characteristics of the wafers and supplying the chemical etching instrument with an active layer thickness map for each wafer. Consequently, the master controller must record the output data from several of the processes since this output data is necessary to perform other processes, such as recording an active layer thickness map for each wafer from the metrology instrument for use by the chemical etching instrument. The master controller also compares the predicted wafer quality with process control and feedback process information to adjust the etching process. This comparison and feedback control provides near real time control of the etching process. The master controller must also record the output data from several of the processes to comply with strict wafer quality production standards.

After each wafer has been processed, the master controller has each wafer routed back to its assigned storage location in the storage cassette, which is then transported, either manually or automatically, back to the storage area to await delivery to a customer or to another processing facility. It should be noted that the wafers are often polished and cleaned before being placed back into the storage area.

As described above, the master controller provides a central control means for ensuring that wafers flow through a processing facility in an efficient and organized manner. By providing this central control means, the costs associated with maintaining an efficient and organized wafer production facility can be decreased since the records and the processing status and control of all the wafers are maintained in and initiated from, respectively, a central location, thereby eliminating data retrieval and data entry and individual process control monitoring often associated with singular wafer processing functions in wafer production environments. Furthermore, this central control means allows the various wafer processing instruments to be located in close proximity to one another, thereby making the necessary high levels of wafer processing environment cleanliness more feasible as well as providing near real time control of the etch process.

From the above descriptive summary it is apparent that the present invention allows individual wafer processing instruments to be centrally controlled to ensure that wafers flow through a wafer processing facility in an efficient and organized manner and are produced with the desired quality.

Accordingly, it is one object of the present invention to provide a wafer processing facility with a high degree of cleanliness having a central control means to decrease the costs associated with maintaining such an environment with respect to either equipment or labor or both and to provide near real time process control.

Other objects and advantages of the present invention will become apparent to those skilled in the art from the following detailed description read in conjunction with appended claims and the changes attached hereto.

BRIEF DESCRIPTION OF THE DRAWINGS

In order to facilitate a fuller understanding of the present invention, reference is now made to the appended drawings. These drawings, not drawn to scale, should not be construed as limiting the present invention, but are intended to be exemplary only.

DETAILED DESCRIPTION OF THE INVENTION

Figure 1:
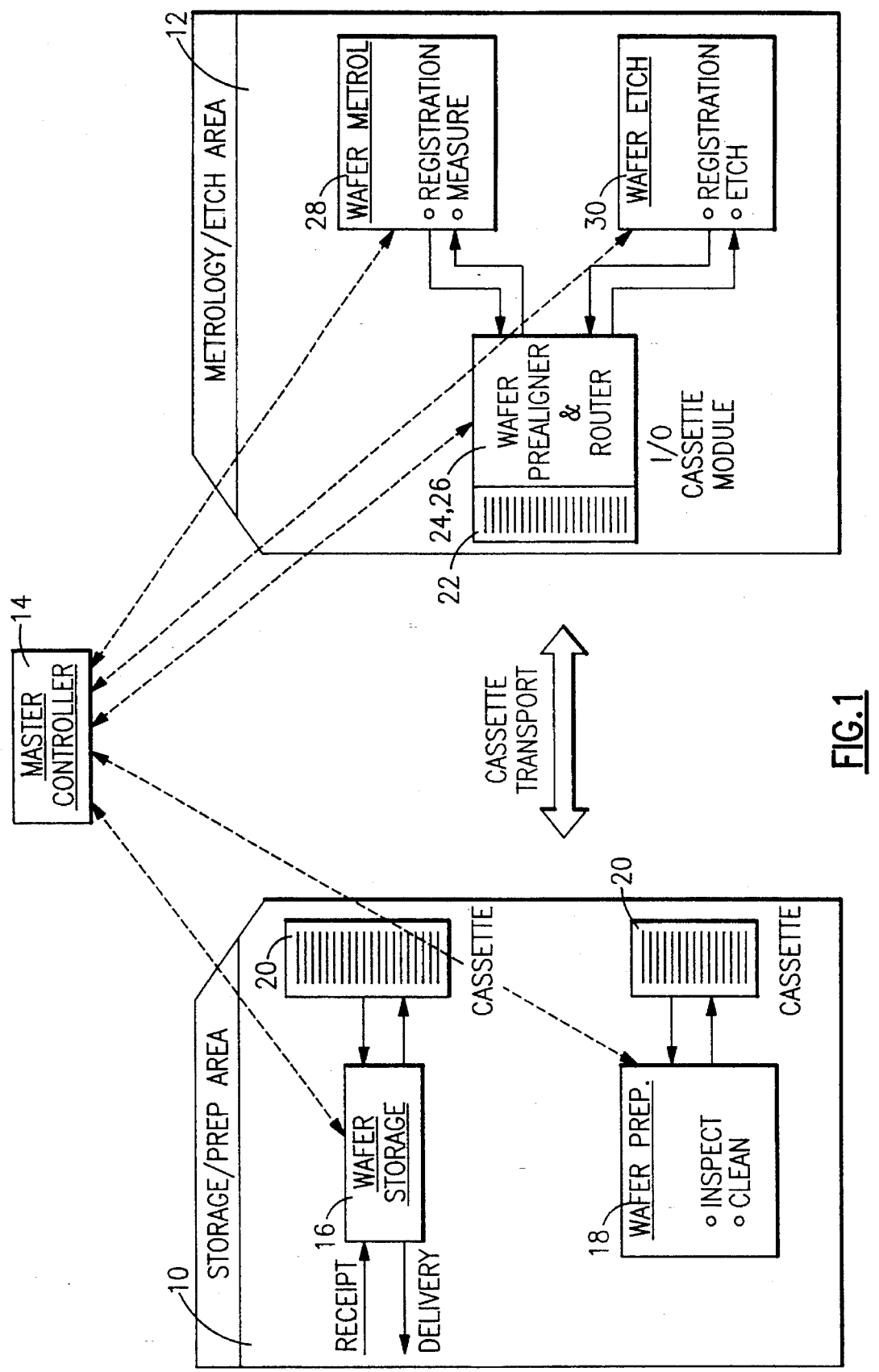
FIG. 1 is a schematic diagram of an overall wafer flow diagram of a semiconductor wafer processing facility embodying the principles of the present invention.

Referring to FIG. 1, there is shown an overall wafer flow diagram of a semiconductor wafer processing facility embodying the principles of the present invention. This facility includes a wafer storage and preparation area 10 and a wafer metrology and etch area 12, both of which are monitored and/or controlled by a master controller 14. The wafer storage and preparation area 10 is typically maintained at a class 10 clean room level and includes a wafer storage area 16 and a wafer preparation area 18. The wafer storage area 16 provides storage for wafer storage cassettes 20, each typically carrying up to twenty-five semiconductor wafers, that are being received in or delivered to the semiconductor wafer processing facility. The wafer storage area 16 also provides storage for wafer storage cassettes 20 containing semiconductor wafers that have started, but have not yet completed, processing. The wafer preparation area 18 allows for incoming and outgoing, or pre-processed and post-processed, wafers to be cleaned and inspected. The cleaning process may consist of several levels, with the highest level being that of polishing the wafers to rid them of any pre-processing or post-processing contaminants. The inspection process is typically a visual inspection process, but it may be automated to promote efficiency.

It should be noted that the semiconductor wafers are transported, either manually or automatically, between the wafer storage area 16 and the wafer preparation area 18, as well as between the wafer storage and preparation area 10 and the wafer metrology and etch area 12, within the wafer storage cassettes 20. The wafer storage cassettes 20 are identifiably marked in some manner, such as by bar coding, so that they may be identified and tracked throughout the wafer processing facility. Furthermore, the semiconductor wafers are organized within the wafer storage cassettes 20 so that they may be individually identified along with each wafer storage cassette 20.

The wafer metrology and etch area 12 is typically kept at a class 1000 clean room level and includes an input/output (IO) cassette module 22, a wafer pre-aligner 24, a wafer router 26, a wafer metrology instrument 28, and a wafer etching instrument 30. The I/O cassette module 22 provides an environmentally controlled input/output interface for the wafer storage cassettes 20, and hence the semiconductor wafers stored therein, between the wafer storage and preparation area 10 and the wafer metrology and etch area 12. This controlled interface is required because the wafer storage and preparation area 10 and the wafer metrology and etch area 12 are maintained at different class clean room levels. This controlled interface is also required because the I/O cassette module 22, the wafer pre-aligner 24, the wafer router 26, the wafer metrology instrument 28, and the wafer etching instrument 30 are all typically maintained at a soft vacuum level during wafer processing to promote cleanliness.

The I/O cassette module 22 accepts an entire wafer storage cassette 20 in a manner that provides the wafer router 26, which is typically a robotic arm, with access to each semiconductor wafer stored therein. This accessibility may be provided in several fashions, although the preferred method is to supply the I/O cassette module 22 with an elevator mechanism for moving the entire wafer storage cassette 20 so that each semiconductor wafer stored therein may be positioned at the operating level of the wafer router 26. Another method would be to provide the wafer router 26 with maneuvering capabilities to allow each semiconductor wafer to be individually accessed within a wafer storage cassette 20 that is stationary within the I/O cassette module 22.

Once the wafer router 26 has accessed a semiconductor wafer from the wafer storage cassette 20, the semiconductor wafer must be oriented into a position that allows for its proper acceptance by both the wafer metrology instrument 28 and the wafer etching instrument 30. This orientation procedure is required because the semiconductor wafer typically is not precisely oriented within the wafer storage cassette 20 and, as will be described shortly, the proper orientation of the semiconductor wafer in both the wafer metrology instrument 28 and the wafer etching instrument 30 is critical for proper semiconductor wafer processing. The orientation procedure is performed by the wafer pre-aligner 24 and it consists of orienting each semiconductor wafer according to its generic physical characteristics. As is common knowledge within the semiconductor industry, semiconductor wafers are generally created with either a flat or a notch to allow for their proper orientation. Thus, the wafer pre-aligner 24 orients the semiconductor wafer according to its flat or notch to allow for its proper acceptance by both the wafer metrology 28 and the wafer etching 30 instruments.

Once the semiconductor wafer has been properly oriented, the wafer router 26 will transport the semiconductor wafer to either the wafer metrology instrument 28 or the wafer etching instrument 30. As previously described, the proper orientation of the semiconductor wafer in both the wafer metrology instrument 28 and the wafer etching instrument 30 is critical for proper semiconductor wafer processing. Such is the case because the wafer metrology instrument 28 measures the thickness of the outer material layer of the semiconductor wafer and a highly detailed outer material layer thickness map is generated from these measurements that is later used by the wafer etching instrument 30 to uniformly thin and smooth the outer material layer of the semiconductor wafer. Thus, since the wafer etching instrument 30 uses a detailed thickness map that is generated from measurements taken by the wafer metrology instrument 28, the orientation of the semiconductor wafer in the wafer metrology instrument 28 must directly correlate with the orientation of the semiconductor wafer in the wafer etching instrument 30. Accordingly, within both the wafer metrology instrument 28 and the wafer etching instrument 30 is a registration apparatus for consistently registering the semiconductor wafer to both the wafer metrology instrument 28 and the wafer etching instrument 30, respectively, to ensure that the semiconductor wafer is properly processed. The wafer pre-aligner 24 merely assists these registration apparatuses by orienting the semiconductor wafer according to its flat or notch. Of course, if these registration apparatuses could consistently register a non-pre-aligned semiconductor wafer to both the wafer metrology instrument 28 and the wafer etching instrument 30, then there would be no use for the wafer pre-aligner 24.

At this point it should be noted that the master controller 14 acts to keep records as well as inventory and status information relating to the semiconductor wafers in the wafer storage and preparation area 10, whereas it controls the entire wafer flow operation in the wafer metrology and etch area 12. This control includes controlling the elevator mechanism within the I/O cassette module 22, controlling the operation of the wafer router 26 and the wafer pre-aligner 24, controlling the operation of the wafer metrology instrument 28 and generating the outer material layer thickness maps, supplying these outer material layer thickness maps to the wafer etching instrument 30 and controlling the operation of the wafer etching instrument 30, and maintaining the soft vacuum level in the I/O cassette module 22, the wafer pre-aligner 24, the wafer router 26, the wafer metrology instrument 28, and the wafer etching instrument 30 during wafer processing.

Figure 2:
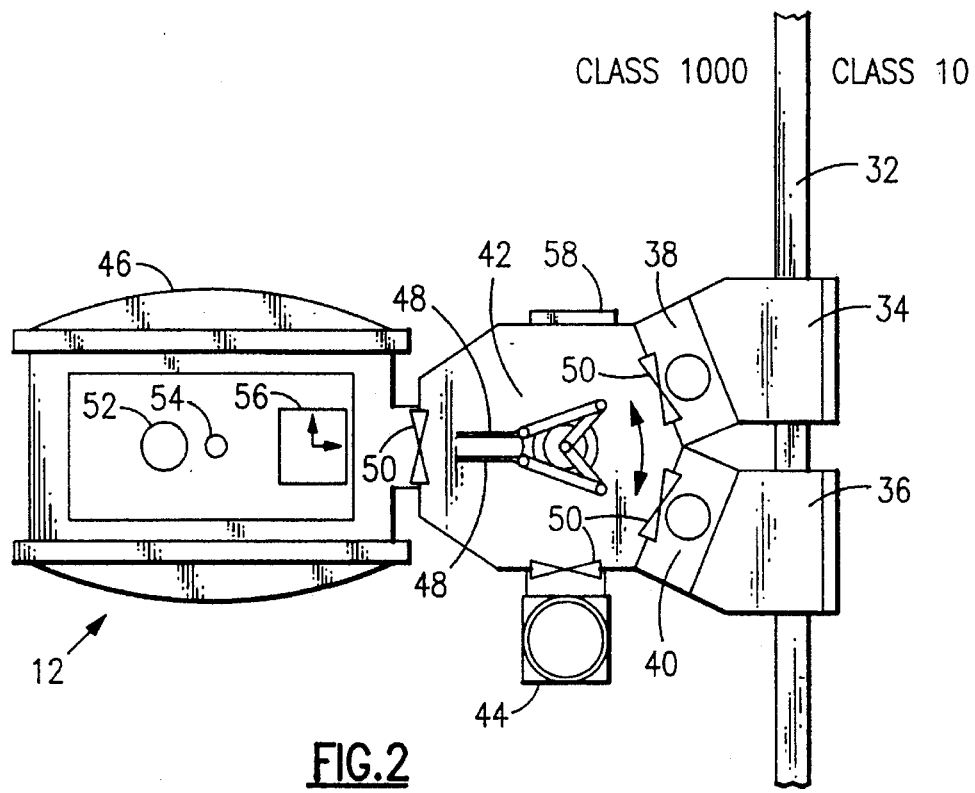
FIG. 2 is an assembly drawing of the metrology/etch area of the semiconductor wafer processing facility shown in FIG. 1.

Referring to FIG. 2, there is shown an assembly drawing of one embodiment of the wafer metrology and etch area 12. This area includes an isolation wall 32, for separating the class 1000 clean room level area from the class 10 clean room level area, with a primary 34 and a secondary 36 I/O cassette module mounted therein. Adjacent to each I/O cassette module 34, 36 is a corresponding wafer pre-aligner 38, 40, respectively. Two I/O cassette modules 34, 36 and two wafer pre-aligners 38, 40 are used here to reduce down-time in the wafer processing facility, as will be described shortly. Each cassette module 34, 36 is capable of accepting an entire wafer storage cassette 20.

At the center of the wafer metrology and etch area 12 is a wafer router 42 which, as shown, is typically a robotic arm. The robotic arm 42 is adjacent to the two wafer pre-aligners 38, 40, and a wafer metrology instrument 44 and a wafer etching instrument 46 are correspondingly adjacent to the robotic arm 42. The robotic arm 42 has access into each I/O cassette module 34, 36, and hence to each storage cassette 20 and to each semiconductor wafer stored therein, through the respective wafer pre-aligners 38, 40. The robotic arm 42 also has access into the wafer metrology instrument 44 and the wafer etching instrument 46. The robotic arm 42 operates by rotating about its axis and extending a pair of limb members 48 into an adjacent instrument or module. The robotic arm 42 may be, and often is, physically isolated from the adjacent instruments and modules by a plurality of valves 50 that are primarily provided for preventing contaminants from propagating between the different instruments and modules. As previously described, the I/O cassette modules 34, 36, the wafer pre-aligners 38, 40, the robotic arm 42, the wafer metrology instrument 44, and the wafer etching instrument 46 are all maintained at a soft vacuum level to promote cleanliness. Thus, the valves 50 also allow a particular instrument or module to be maintained at a different pressure level from the others. This feature allows a particular instrument or module to be cleaned or serviced without affecting the operation of the others. This feature also allows either I/O cassette module 34, 36 to be independently vented-up to ambient level and/or pumped-down to vacuum level to allow wafer storage cassettes 20 to be exchanged in one I/O cassette module while still allowing robot arm access to the other I/O cassette module, thereby reducing down-time in the wafer processing facility.

Within the wafer etching instrument 46 is a large etching tool 52 and a small etching tool 54 for performing large and small wafer etching processes, respectively. Also within the wafer etching instrument 46 is a stage 56 for guiding the semiconductor wafer under the large 52 and small 54 etching tools for processing. An extra port 58 is provided adjacent to the robotic arm 42 to allow for additional processing equipment to be mounted thereto.

Figure 3:
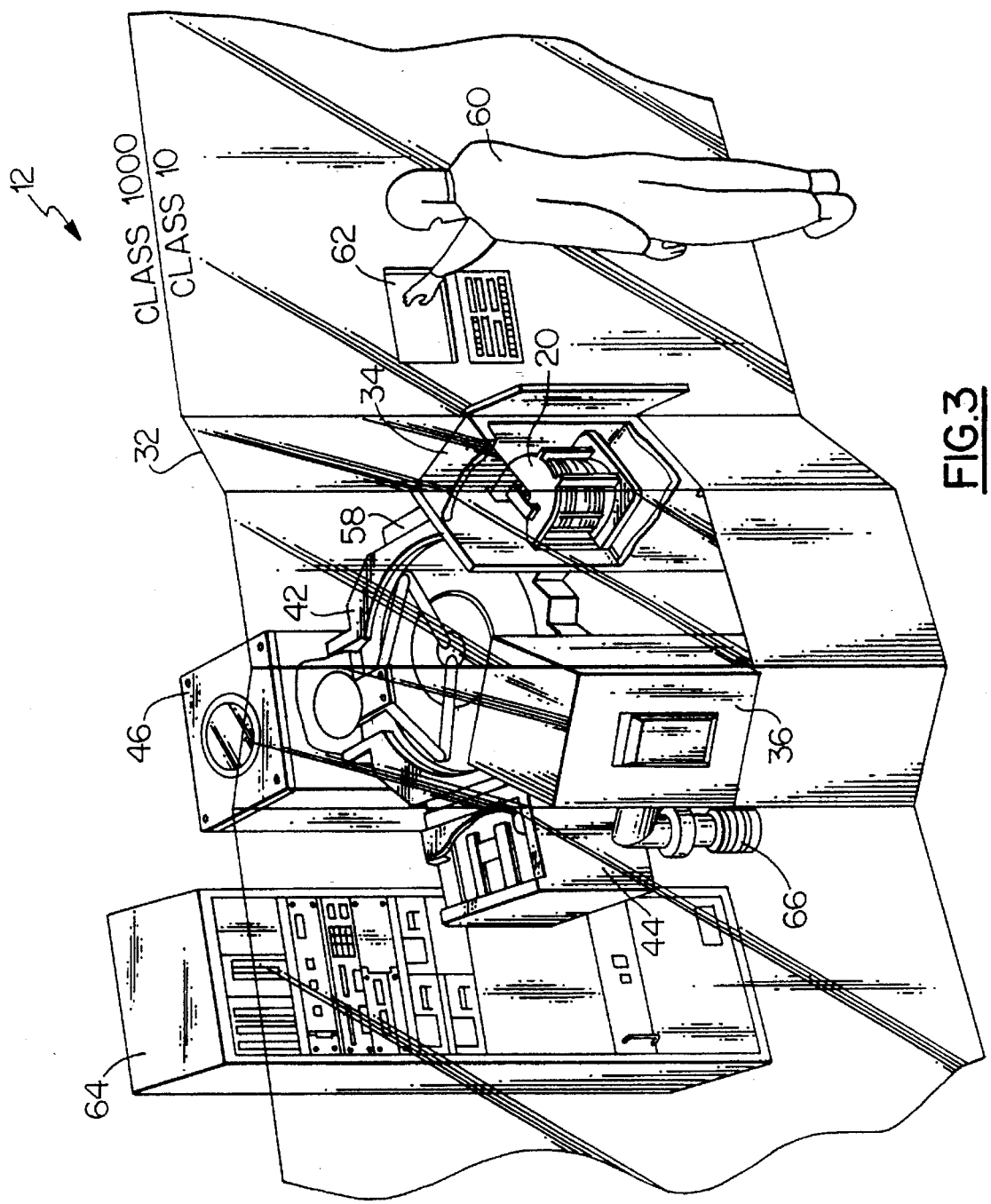
FIG. 3 is a sketch of the metrology/etch area of the semiconductor wafer processing facility shown in FIG. 1.

Referring to FIG. 3, there is shown an artist's sketch of the wafer metrology and etch area 12 shown in FIG. 2. In addition to the components shown in FIG. 2, FIG. 3 shows a user 60 interfacing with a workstation panel 62 which is connected to the master controller 64. This workstation panel 62 provides the user 60 with the benefit of interfacing with the master controller 64, for entering or accessing master controller data, without entering the class 1000 clean room area. The master controller 64 is shown situated in the class 1000 clean room area, however it need not be confined to this location. FIG. 3 also shows tubing 66 connected to the secondary I/O cassette module 36 for allowing this module to be vented-up to ambient level and/or pumped-down to vacuum level.

Figure 4:
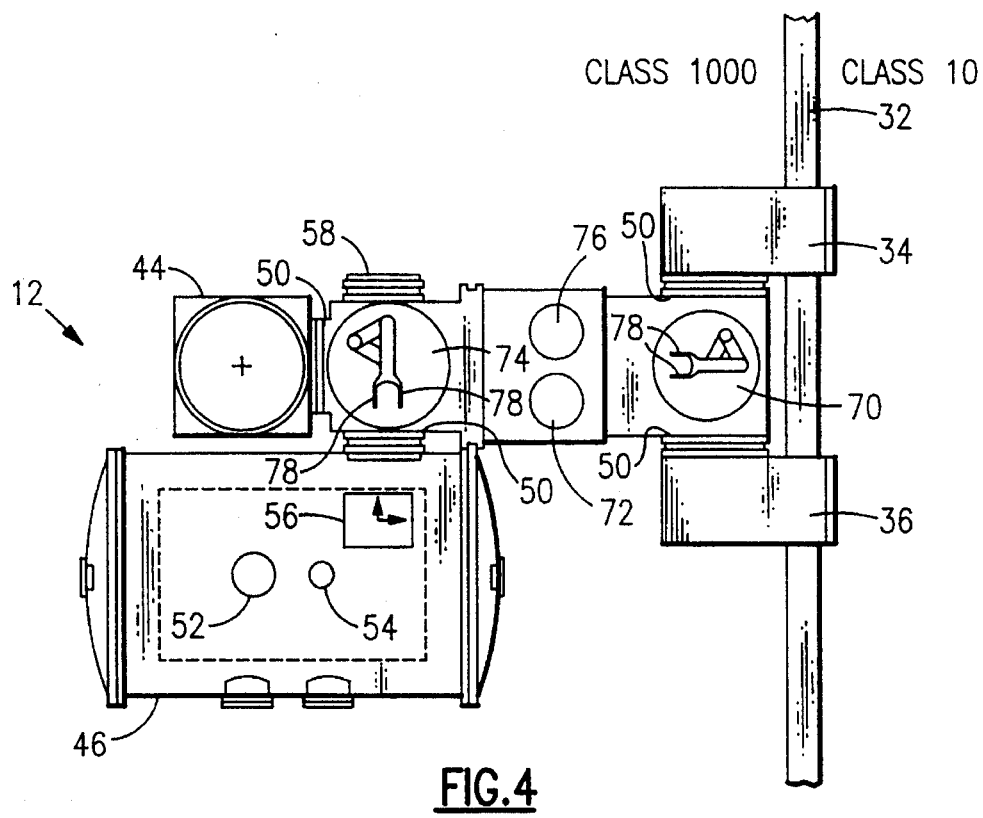
FIG. 4 is an assembly drawing of an alternate embodiment of the metrology/etch area of the semiconductor wafer processing facility shown in FIG. 1.

Referring to FIG. 4, there is shown an assembly drawing of an alternate embodiment of the wafer metrology and etch area 12. This area 12 includes many of the same components that are shown in FIGS. 2 and 3, so therefore these components are accordingly numbered as such. In addition to these common components, the wafer metrology and etch area 12 shown in FIG. 4 maintains a primary robotic arm 70, a single wafer pre-aligner 72, a secondary robotic arm 74, and a wafer output buffer 76. The wafer pre-aligner 72 and the wafer output buffer 76 are located midway between and are accessible by the primary robotic arm 70 and the secondary robotic arm 74. The primary robotic arm 70 has access into each I/O cassette module 34, 36, and hence to each storage cassette 20 and to each semiconductor wafer stored therein. The secondary robot arm 74 has access into the wafer metrology instrument 44 and the wafer etching instrument 46. Similar to the robotic arm 42 shown in FIGS. 2 and 3, the primary and secondary robotic arms 70, 74 operate by rotating about their axes and by extending a pair of limb members 78 into adjacent instruments and/or modules. Similar to the primary and secondary wafer pre-aligners 38, 40 shown in FIG. 2, the wafer pre-aligner 72 orients each semiconductor wafer according to its flat or notch to allow for its proper acceptance by both the wafer metrology 44 and the wafer etching 46 instruments. The wafer output buffer 76 is primarily used as a hand-off point from the secondary robotic arms 74 to the primary robot arm 70 after each semiconductor wafer has been processed.

Figure 5:
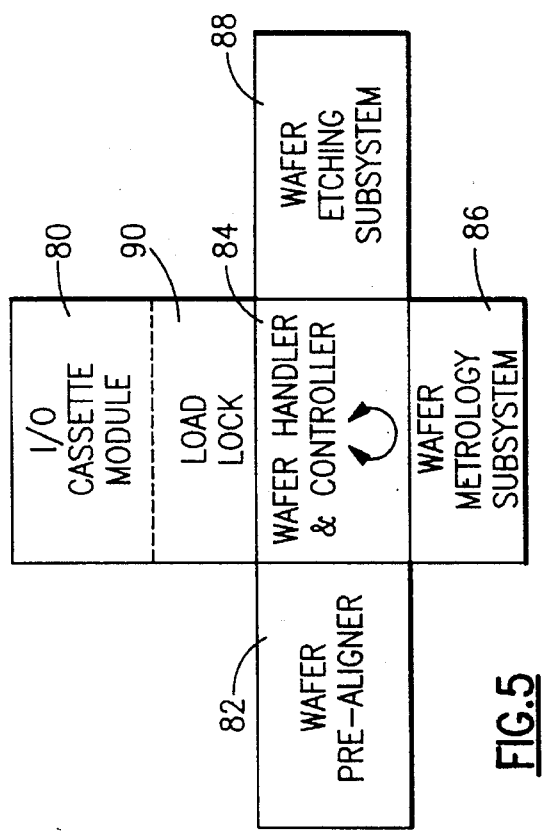
FIG. 5 is a baseline component chart of the metrology/etch area of the semiconductor wafer processing facility shown in FIG. 1 during a typical wafer processing operation.

Referring to FIG. 5, there is shown a baseline component chart of the wafer metrology and etch area 12 during a typical wafer processing operation. Similar to the embodiments shown in FIGS. 2 and 4, the baseline component chart includes an I/O cassette module 80, a wafer pre-aligner 82, a wafer handler and controller 84, a wafer metrology subsystem 86, and a wafer etching subsystem 88. Also shown is a load/lock component 90, that is associated with the I/O cassette module 80, which indicates that a wafer storage cassette 20 has been loaded into the I/O cassette module 80 and the system is locked in an airtight manner so that it may be brought to a soft vacuum level. It should be noted that although the wafer handler and controller 84 is shown as having access to the I/O cassette module 80, the wafer pre-aligner 82, the wafer metrology subsystem 86, and the wafer etching subsystem 88, a typical wafer processing operation is arranged such that the wafer handler and controller 84 first transports each semiconductor wafer from the I/O cassette module 80 to the wafer pre-aligner 82 where it is properly oriented. The wafer handler and controller 84 then transports the semiconductor wafer to the wafer metrology subsystem 86 where an outer material layer thickness map is generated. The semiconductor wafer is then transported to the wafer etching subsystem 88 where it is etched according to the outer material layer thickness map. The semiconductor wafer is then transported back to the wafer metrology subsystem where it is determined whether or not the etching process successfully thinned the wafer to a desired thickness. If it has, the processed semiconductor wafer is transported to the I/O cassette module 80 for storage. If it has not, another outer material layer thickness map is generated and the semiconductor wafer is transported back to the wafer etching subsystem 88 where it is etched according to the newly generated outer material layer thickness map. This procedure is repeated until each semiconductor wafer stored in the I/O cassette module 80 has been processed.

Although no master controller is shown in FIG. 5, it should be emphasized that the master controller 14, as shown in FIG. 1, controls the entire wafer flow operation in the wafer metrology and etch area 12. As previously stated, this control includes controlling an elevator mechanism within the I/O cassette module 80, controlling the operation of the wafer handler 84 and the wafer pre-aligner 82, controlling the operation of the wafer metrology subsystem 86 and generating outer material layer thickness maps therefrom, generating prediction maps, comparing actual thickness maps with predicted thickness maps, calculating and feeding back of process control information to the etching process, supplying outer material layer thickness maps to the wafer etching subsystem 88 and controlling the operation of the same, and maintaining the soft vacuum level in the I/O cassette module 80, the wafer pre-aligner 82, the wafer handler 84, the wafer metrology subsystem 86, and the wafer etching subsystem 88 during wafer processing. Significantly, the master controller, upon comparing the actual thickness maps with the predicted thickness maps and then providing process control information to the etching process, thus maintains near real time process control. That is, the number of iterations required for processing a wafer through the wafer etching subsystem 88 is minimized since each iteration generally results in the more direct comparison between the actual thickness map and the predicted thickness map. Consequently, unlike conventional semiconductor process control techniques, the etching process parameters are controlled in near real time. Such control is maintained by connecting each of these modules and subsystems to the master controller 14, and in some cases to each other, with a data transmission scheme such as an ethernet network employing a variety of different transmission protocols. The preferred transmission protocols include TCP/IP and MESC, although many industry standard or application specific protocols may also be utilized. It should be noted that many, if not all, of the modules and subsystems will have their own controllers and therefore require only minimal management by the master controller 14. However, the master controller 14 ensures that all of the modules and subsystems work in concert with each other to ensure that the semiconductor wafers flow through the wafer processing facility in an efficient and organized manner.

Figure 6:
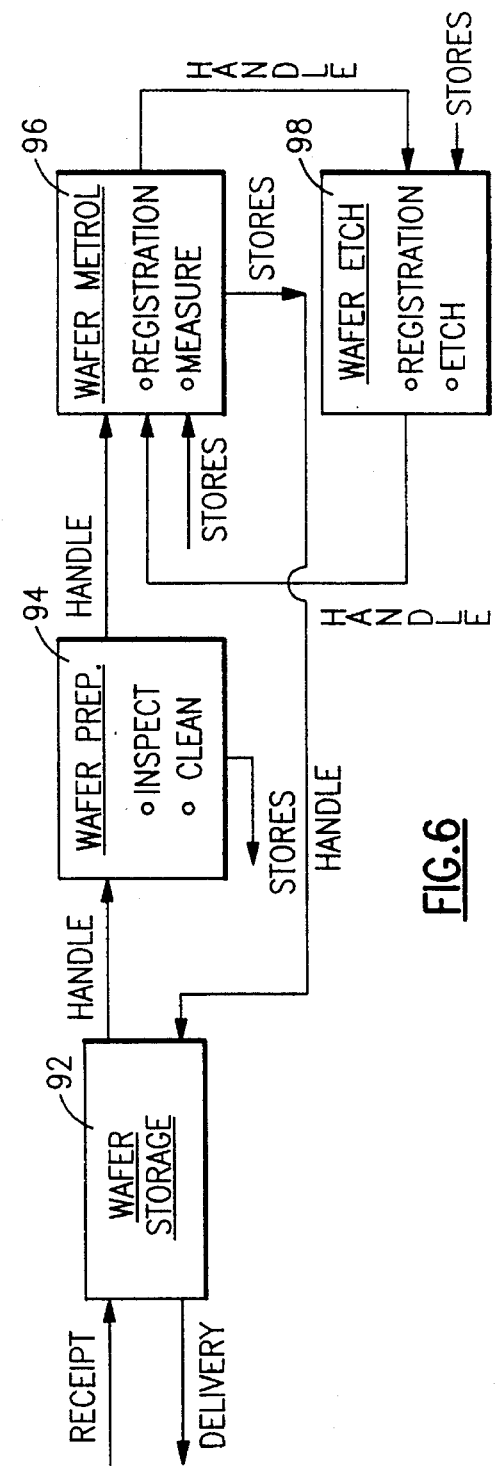
FIG. 6 is a baseline flow chart of a totally on-line, continuous feed semiconductor wafer processing facility.

Referring to FIG. 6, there is shown a baseline flow chart of totally on-line, continuous feed semiconductor wafer processing facility. Similar to FIG. 1, the baseline flow chart includes a wafer storage area 92, a wafer preparation area 94, a wafer metrology instrument 96, and a wafer etching instrument 98. The function of these areas and instruments are similar to their counterparts described, however the handling of the semiconductor wafers between these areas and instruments is totally automated. Such automation may be accomplished with a track or conveyer system that is partially or totally under the control of a master controller. As shown, the semiconductor wafers can be transported directly from the wafer storage area 92 to either the wafer metrology instrument 96 or the wafer etching instrument 98, as well as to the wafer preparation area 94. This is beneficial since the wafer metrology instrument 96 typically operates much faster than the wafer etching instrument 98, and therefore several semiconductor wafers may be processed and transported back to the wafer storage area 92 while the wafer etching instrument 98 is still processing a single semiconductor wafer. Of course, with such an arrangement the entire semiconductor wafer processing facility must be kept at a high clean room level.

It should be noted that while no wafer pre-aligner is shown in FIG. 6, the wafer pre-aligner function is still required prior to the wafer metrology and wafer etching functions unless the registration apparatuses could consistently register non-pre-aligned semiconductor wafers to both the wafer metrology instrument 96 and the wafer etching instrument 98.

With the preferred embodiments of the present invention wafer flow architecture now fully described it can thus be seen that the primary objective set forth above is efficiently attained and, since certain changes may be made in the above described architecture without departing from the scope of the invention, it is intended that all matter contained in the above description or shown in the accompanying drawings shall be interpreted as illustrative and not in a limiting sense.

What is claimed is:

1. A method for controlling the flow of semiconductor wafers through a semiconductor wafer processing facility, said method comprising the steps of:

storing a plurality of semiconductor wafers in an identifiable manner in a cassette module;

measuring material layer thicknesses in said plurality of semiconductor wafers with a wafer metrology instrument;

removing material from said plurality of semiconductor wafers with a wafer etching instrument so as to achieve a desired material layer thickness as measured by said wafer metrology instrument;

routing said plurality of semiconductor wafers between said cassette module, said wafer metrology instrument, and said wafer etching instrument; and controlling the flow of said plurality of semiconductor wafers between said cassette module, said wafer metrology instrument, and said wafer etching instrument by controlling and networking the operations of said cassette module, said wafer metrology instrument, said wafer etching instrument, and said wafer routing means to achieve said desired material layer thickness in each of said plurality of semiconductor wafers in an efficient and organized manner.

2. The method as defined in claim 1, further comprising the step of storing said plurality of semiconductor wafers in a cassette before and after processing.

3. The method as defined in claim 1, further comprising the step of cleaning and inspecting said plurality of semiconductor wafers before and after processing.

4. The method as defined in claim 1 further comprising the steps of:

predicting a material layer thickness of each one of said plurality of semiconductor wafers;

remeasuring, subsequent to said material removal step, said material layer thickness of each one of said plurality of semiconductor wafers;

comparing said predicted material thickness with said remeasured material layer thickness for each of said plurality of semiconductor wafers; and adjusting said wafer etching instrument based upon said comparison of said predicted and said remeasured material thicknesses.

5. An apparatus for controlling the flow of semiconductor wafers through a semiconductor wafer processing facility, said apparatus comprising:

a cassette module for storing a plurality of semiconductor wafers in an identifiable manner;

a wafer metrology instrument for measuring material layer thicknesses in said plurality of semiconductor wafers;

a wafer etching instrument for removing material from said plurality of semiconductor wafers to achieve a desired material layer thickness as measured by said wafer metrology instrument:

means for routing said plurality of semiconductor wafers between said cassette module, said wafer metrology instrument, and said wafer etching instrument; and a master controller for controlling the flow of said plurality of semiconductor wafers between said cassette module, said wafer metrology instrument, and said wafer etching instrument by controlling and networking the operations of said cassette module, said wafer metrology instrument, said wafer etching instrument, and said wafer routing means to achieve said desired material layer thickness in each of said plurality of semiconductor wafers in an efficient and organized manner.

6. The apparatus as defined in claim 5, further comprising an alignment mechanism for orienting said plurality of semiconductor wafers into a position that allows for proper acceptance by said wafer metrology instrument and said wafer etching instrument.

7. The apparatus as defined in claim 6, further comprising registration means for properly registering said plurality of semiconductor wafers to said wafer metrology instrument and said wafer etching instrument.

8. The apparatus as defined in claim 7, wherein said cassette module, said wafer metrology instrument, said wafer etching instrument, and said wafer routing means form a gastight enclosure that is maintained at a soft vacuum level.

9. The apparatus as defined in claim 8, wherein said cassette module is comprised of an accessible gastight cavity that is capable of storing a cassette holding said plurality of semiconductor wafers.

10. The apparatus as defined in claim 9, wherein said accessible gastight cavity may be independently isolated from said gastight enclosure, and wherein said accessible gastight cavity may be independently vented up and pumped down to said soft vacuum level.

11. The apparatus as defined in claim 9, wherein said cassette module is provided with a mechanism for moving said cassette so as to provide said wafer routing means with access to all of said plurality of semiconductor wafers.

12. The apparatus as defined in claim 11, wherein said mechanism is controlled by said master controller.

13. The apparatus as defined in claim 8, wherein said wafer metrology instrument is comprised of an accessible gastight cavity and instrumentality for measuring the thickness of the outer material layers of said plurality of semiconductor wafers.

14. The apparatus as defined in claim 13, wherein said master controller controls the operation of said wafer metrology instrument and records said outer layer thickness measurements for use by said wafer etching instrument.

15. The apparatus as defined in claim 14, wherein said accessible gastight cavity may be independently isolated from said gastight enclosure.

16. The apparatus as defined in claim 8, wherein said wafer etching instrument is comprised of an accessible gastight cavity containing instrumentality for removing material from the outer layers of said plurality of semiconductor wafers.

17. The apparatus as defined in claim 16, wherein said master controller controls the operation of said wafer etching instrument.

18. The apparatus as defined in claim 17, wherein said accessible gastight cavity may be independently isolated from said gastight enclosure.

19. The apparatus as defined in claim 8, wherein said wafer routing means is comprised of an accessible gastight cavity containing instrumentality for transporting said plurality of semiconductor wafers between said cassette module, said wafer metrology instrument, and said wafer etching instrument.

20. The apparatus as defined in claim 19, wherein said instrumentality is comprised of a robotic arm centrally located between said cassette module, said wafer metrology instrument, and said wafer etching instrument.

21. The apparatus as defined in claim 20, wherein said master controller controls the operation of said robotic arm.

22. The apparatus as defined in claim 21, wherein said accessible gastight cavity may be independently isolated from said gastight enclosure.

23. The apparatus as defined in claim 8, wherein said master controller is comprised of electronic computing and storage means for electronically controlling and networking the operations of said cassette module, said wafer metrology instrument, said wafer etching instrument, and said wafer routing means.

24. The apparatus as defined in claim 23, wherein said master controller stores said material layer thickness measurements taken by said wafer metrology instrument and supplies them to said wafer etching instrument.

25. The apparatus as defined in claim 23, wherein said master controller performs fault isolation and other diagnostics for said semiconductor wafer processing facility.

26. The apparatus as defined in claim 23, wherein said master controller stores the processing records on said plurality of semiconductor wafers.

27. The apparatus as defined in claim 23, wherein said master controller records the processing status on said plurality of semiconductor wafers.

28. The apparatus as defined in claim 5, further comprising a wafer storage area for storing a cassette of said plurality of semiconductor wafers before and after processing.

29. The apparatus as defined in claim 5, further comprising a wafer preparation area for cleaning and inspecting said plurality of semiconductor wafers before and after processing.

* * * * *